US010963614B2

(12) United States Patent
Kim et al.

(10) Patent No.: US 10,963,614 B2
(45) Date of Patent: Mar. 30, 2021

(54) METHOD OF MANUFACTURING PHOTOMASKS AND METHOD OF MANUFACTURING SEMICONDUCTOR DEVICES

(71) Applicant: Samsung Electronics Co., Ltd., Suwon-si (KR)

(72) Inventors: Jeonglim Kim, Seoul (KR); Youngdeok Kwon, Suwon-si (KR); Myungsoo Noh, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/845,506

(22) Filed: Apr. 10, 2020

(65) Prior Publication Data
US 2021/0019466 A1    Jan. 21, 2021

(30) Foreign Application Priority Data

Jul. 15, 2019   (KR) ........................ 10-2019-0085119

(51) Int. Cl.
*G06F 30/392*   (2020.01)
*G03F 7/20*   (2006.01)

(52) U.S. Cl.
CPC ........ *G06F 30/392* (2020.01); *G03F 7/70033* (2013.01); *G03F 7/70441* (2013.01); *G03F 7/70625* (2013.01); *H01J 2237/31769* (2013.01)

(58) Field of Classification Search
CPC .............. G06F 30/392; G03F 7/70033; G03F 7/70625; G03F 7/70441; H01J 2237/31769
See application file for complete search history.

(56) References Cited

U.S. PATENT DOCUMENTS

| 7,241,542 | B2 | 7/2007 | Hudek et al. |
| 7,617,477 | B2 | 11/2009 | Ye et al. |
| 8,227,151 | B2 | 7/2012 | Inanami et al. |
| 8,443,308 | B2 | 5/2013 | Shiely et al. |
| 8,617,773 | B2 | 12/2013 | Uno et al. |
| 8,887,104 | B2 | 11/2014 | Liu et al. |
| 9,116,438 | B2 | 8/2015 | Lee et al. |
| 9,436,080 | B2 * | 9/2016 | Beyer ................ G03F 7/70466 |

(Continued)

FOREIGN PATENT DOCUMENTS

| KR | 100904600 | 6/2009 |
| KR | 1020090099404 | 9/2009 |

(Continued)

*Primary Examiner* — Stacy Whitmore
(74) *Attorney, Agent, or Firm* — Myers Bigel, P.A.

(57) ABSTRACT

In a method of manufacturing a photomask, a layout of a circuit mask pattern in a mask region corresponding to a chip region of a substrate is designed. A layout of a monitoring mask pattern representing a critical dimension (CD) of the circuit mask pattern in the mask region is designed. The monitoring mask pattern includes a mask-critical dimension uniformity (CDU) detection pattern configured to detect CDU in mask and a wafer-CDU detection pattern configured to detect CDU in wafer. A first optical proximity correction (OPC) is performed on the mask-CDU detection pattern. A second optical proximity correction is performed on the wafer-CDU detection pattern. A photomask having the circuit mask pattern and the monitoring mask pattern is formed.

20 Claims, 9 Drawing Sheets

(56) References Cited

U.S. PATENT DOCUMENTS

| | | | |
|---|---|---|---|
| 9,863,761 B2 | 1/2018 | Shi et al. | |
| 10,036,961 B2 | 7/2018 | Jang et al. | |
| 10,303,839 B2 * | 5/2019 | Kekare | G06F 30/392 |
| 2008/0295062 A1 * | 11/2008 | Wu | G06F 30/398 |
| | | | 716/55 |
| 2009/0200546 A1 * | 8/2009 | Marokkey | H02N 99/00 |
| | | | 257/48 |
| 2013/0077101 A1 * | 3/2013 | Sharoni | G03F 7/70625 |
| | | | 356/625 |
| 2013/0295698 A1 * | 11/2013 | Pforr | G03F 1/38 |
| | | | 438/14 |
| 2014/0036243 A1 * | 2/2014 | Beyer | G03F 7/70625 |
| | | | 355/52 |
| 2015/0160550 A1 * | 6/2015 | Kim | G03F 1/38 |
| | | | 216/47 |
| 2016/0062227 A1 * | 3/2016 | Yang | G03F 1/84 |
| | | | 430/5 |
| 2017/0371250 A1 | 12/2017 | Kim et al. | |
| 2020/0174380 A1 * | 6/2020 | Huang | G06F 16/2379 |

FOREIGN PATENT DOCUMENTS

| | | | |
|---|---|---|---|
| KR | 1020100119071 | 11/2010 | |
| KR | 1020110001140 | 1/2011 | |
| WO | WO-2012080008 A2 * | 6/2012 | G03F 1/72 |

* cited by examiner

METHOD OF MANUFACTURING PHOTOMASKS AND METHOD OF MANUFACTURING SEMICONDUCTOR DEVICES

CROSS-REFERENCE TO RELATED APPLICATION

This application claims priority under 35 U.S.C. § 119 to Korean Patent Application No. 10-2019-0085119, filed on Jul. 15, 2019 in the Korean Intellectual Property Office (KIPO), the contents of which are herein incorporated by reference in their entirety.

BACKGROUND

1. Field

Example embodiments relate to a method of manufacturing a photomask and a method of manufacturing a semiconductor device. More particularly, example embodiments relate to a method of manufacturing a photomask used in an EUV (Extreme Ultra-Violet) lithography process and a method of manufacturing a semiconductor device using the same.

2. Description of the Related Art

Integrated circuits can be fabricated on a semiconductor wafer using a photolithography process. A uniformity of critical dimensions (CD) of features on a wafer may become more important as feature sizes of the integrated circuits become smaller. For example, in an EUV lithography using a reflective imaging optic system, optic effects in EUV exposure, such as a shadowing effect, flare effect in a wafer level, etc., may occur thereby causing CD non-uniformity at the wafer level. Thus, a method of reducing and/or preventing the CD non-uniformity due to the optic effects in EUV exposure may be desirable.

SUMMARY

Example embodiments of the inventive concept provide a method of manufacturing photomasks capable of monitoring critical dimensions of features on a photomask and a wafer.

Example embodiments of the inventive concept provide a method of manufacturing semiconductor devices capable of monitoring critical dimensions of an actual pattern.

According to example embodiments of the inventive concept, in a method of manufacturing a photomask, a layout of a circuit mask pattern in a mask region corresponding to a chip region of a substrate is designed. A layout of a monitoring mask pattern representing a critical dimension (CD) of the circuit mask pattern in the mask region is designed. The monitoring mask pattern includes a mask-CDU detection pattern configured to detect CDU in mask and a wafer-CDU detection pattern configured to detect CDU in wafer. A first optical proximity correction (OPC) is performed on the mask-CDU detection pattern. A second optical proximity correction is performed on the wafer-CDU detection pattern. A photomask having the circuit mask pattern and the monitoring mask pattern is formed.

According to example embodiments of the inventive concept, in a method of manufacturing a photomask, a layout of a circuit mask pattern in a mask region corresponding to a chip region of a substrate is designed. A layout of a monitoring mask pattern representing a critical dimension (CD) of the circuit mask pattern in the mask region is designed. The monitoring mask pattern includes a mask-CDU detection pattern and a wafer-CDU detection pattern. A first optical proximity correction (OPC) is performed on the mask-CDU detection pattern. A second optical proximity correction is performed on the wafer-CDU detection pattern and the circuit mask pattern. A photomask having the circuit mask pattern and the monitoring mask pattern is formed. A critical dimension of the mask-CDU detection pattern of the photomask is measured.

According to example embodiments of the inventive concept, in a method of manufacturing a semiconductor device, an etch target layer and a photoresist layer are sequentially formed on a substrate having a chip region and a scribe lane region. A photolithography process is performed on the photoresist layer using a photomask having a circuit mask pattern and a monitoring mask pattern having the same or similar dimension of at least a portion of the circuit mask pattern, the monitoring mask pattern including a mask-CDU detection pattern and a wafer-CDU detection pattern, to form a photoresist pattern having a circuit pattern structure transferred from the circuit mask pattern and a mask-CDU detection pattern structure and a wafer-CDU detection pattern structure transferred from the mask-CDU detection pattern and the wafer-CDU detection pattern of the monitoring mask pattern, respectively. A critical dimension of the wafer-CDU detection pattern structure is measured.

According to example embodiments of the inventive concept, a photomask including a circuit mask pattern and a monitoring mask pattern in a mask region corresponding to a chip region of a substrate may be manufactured. The monitoring mask pattern may include a pattern configured to detect CDU in mask (mask-CDU detection pattern) and a pattern configured to detect CDU in wafer (wafer-CDU detection pattern). The monitoring mask pattern may have a standard cell structure capable of representing a critical dimension of the circuit mask pattern. The circuit mask pattern may be transferred to a circuit layer of an actual logic cell in the chip region, and the monitoring mask pattern may be transferred to the chip region.

A first optical proximity correction may be performed on the mask-CDU detection pattern after manufacturing the photomask as part of a precise inspection for the critical dimension uniformity (CDU) in the photomask. A second optical proximity correction may be performed on the wafer-CDU detection pattern to prevent or reduce the CD non-uniformity at a wafer level.

Accordingly, SEM inspection for measuring a critical dimension may be performed only on the mask-CDU detection pattern of the monitoring mask pattern formed on the photomask. Additionally, when the circuit mask pattern of the photomask is transferred to a wafer, an after-development inspection (ADI) and an after-etching inspection (AEI) may be performed only on a monitoring pattern structure, which is transferred from the wafer-CDU detection pattern.

BRIEF DESCRIPTION OF THE DRAWINGS

Example embodiments will be more clearly understood from the following detailed description taken in conjunction with the accompanying drawings. FIGS. 1 to 13 represent non-limiting, example embodiments as described herein.

DETAILED DESCRIPTION OF EXAMPLE EMBODIMENTS

Hereinafter, example embodiments will be described in detail with reference to the accompanying drawings. The same reference numerals are used for the same constituent elements in the drawings, and redundant description of the same constituent elements will be omitted.

As used herein, the term "and/or" includes any and all combinations of one or more of the associated listed items. It will be understood that when an element is referred to as being "on", "attached" to, "connected" to, "coupled" with, "contacting", etc., another element, it can be directly on, attached, connected to, coupled with or contacting the other element or intervening elements may also be present. In contrast, when an element is referred to as being, for example, "directly on", "directly attached" to, "directly connected" to, "directly coupled" with or "directly contacting" another element, there are no intervening elements present. It is noted that aspects described with respect to one embodiment may be incorporated in different embodiments although not specifically described relative thereto. That is, all embodiments and/or features of any embodiments can be combined in any way and/or combination.

Figure 1:
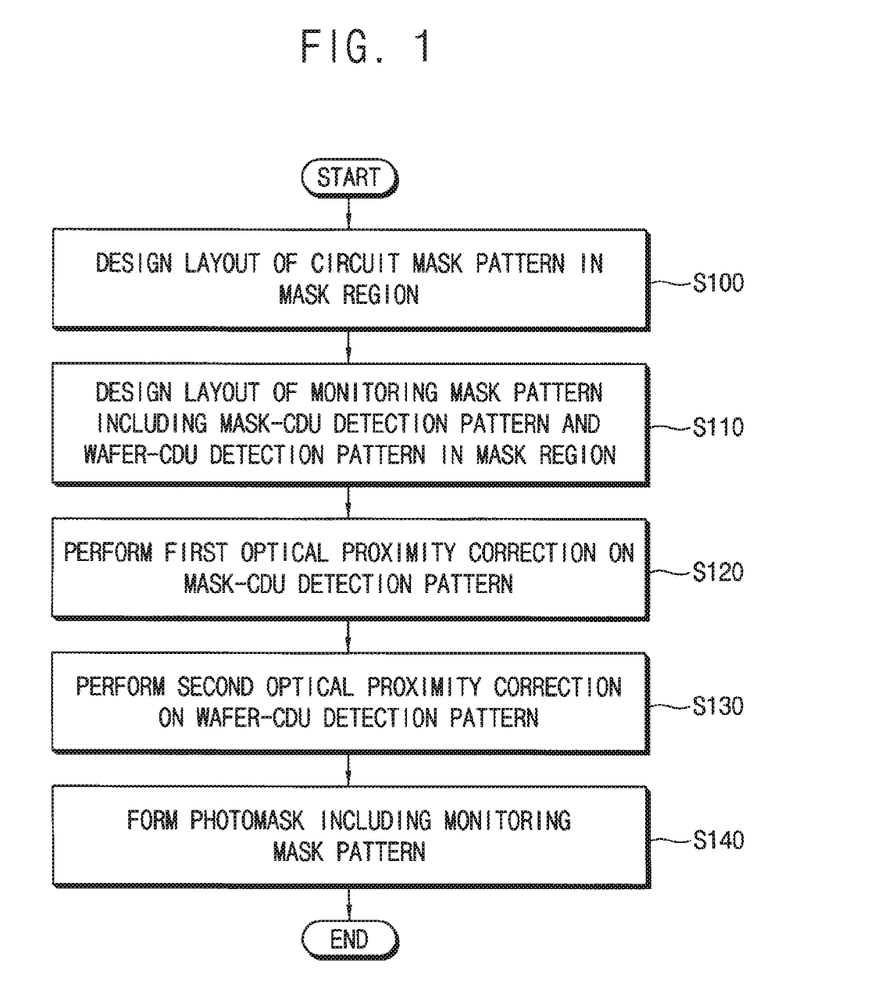
FIG. 1 is a flow chart illustrating a method of manufacturing a photomask in accordance with example embodiments of the inventive concept.
Figure 2:
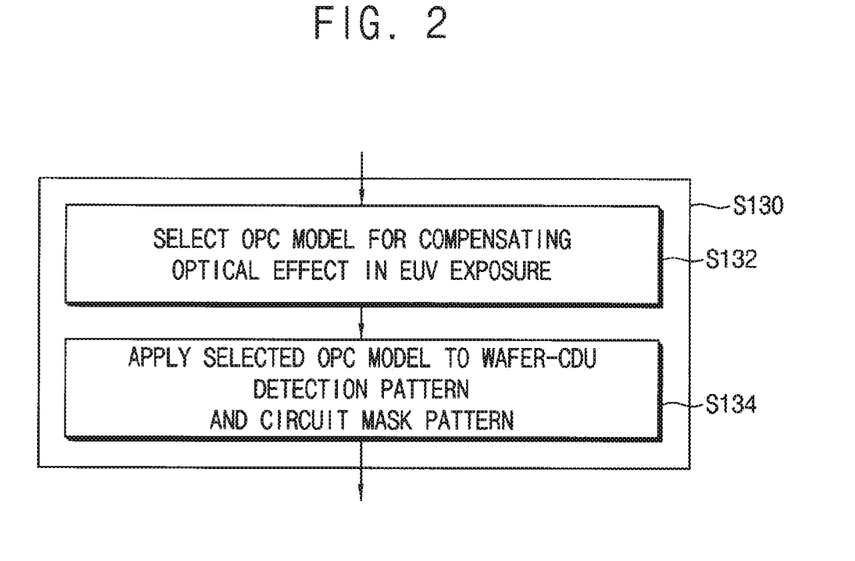
FIG. 2 is a flow chart illustrating a second optical proximity correction step of the method of manufacturing a photomask of FIG. 1.
Figure 3:
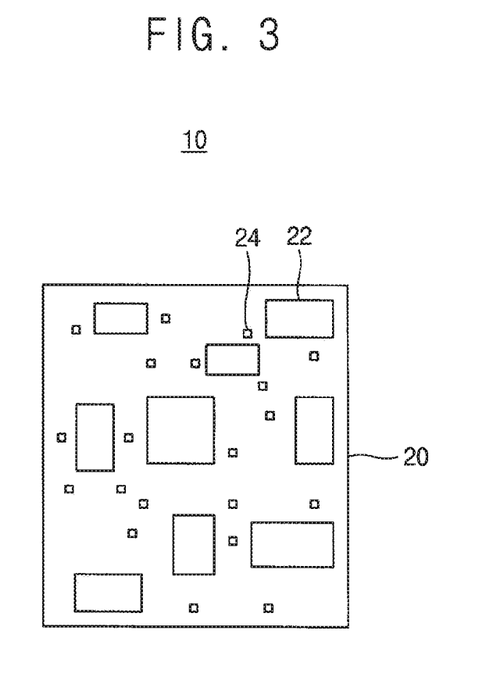
FIG. 3 is a plan view illustrating a photomask in accordance with example embodiments of the inventive concept.
Figure 4:
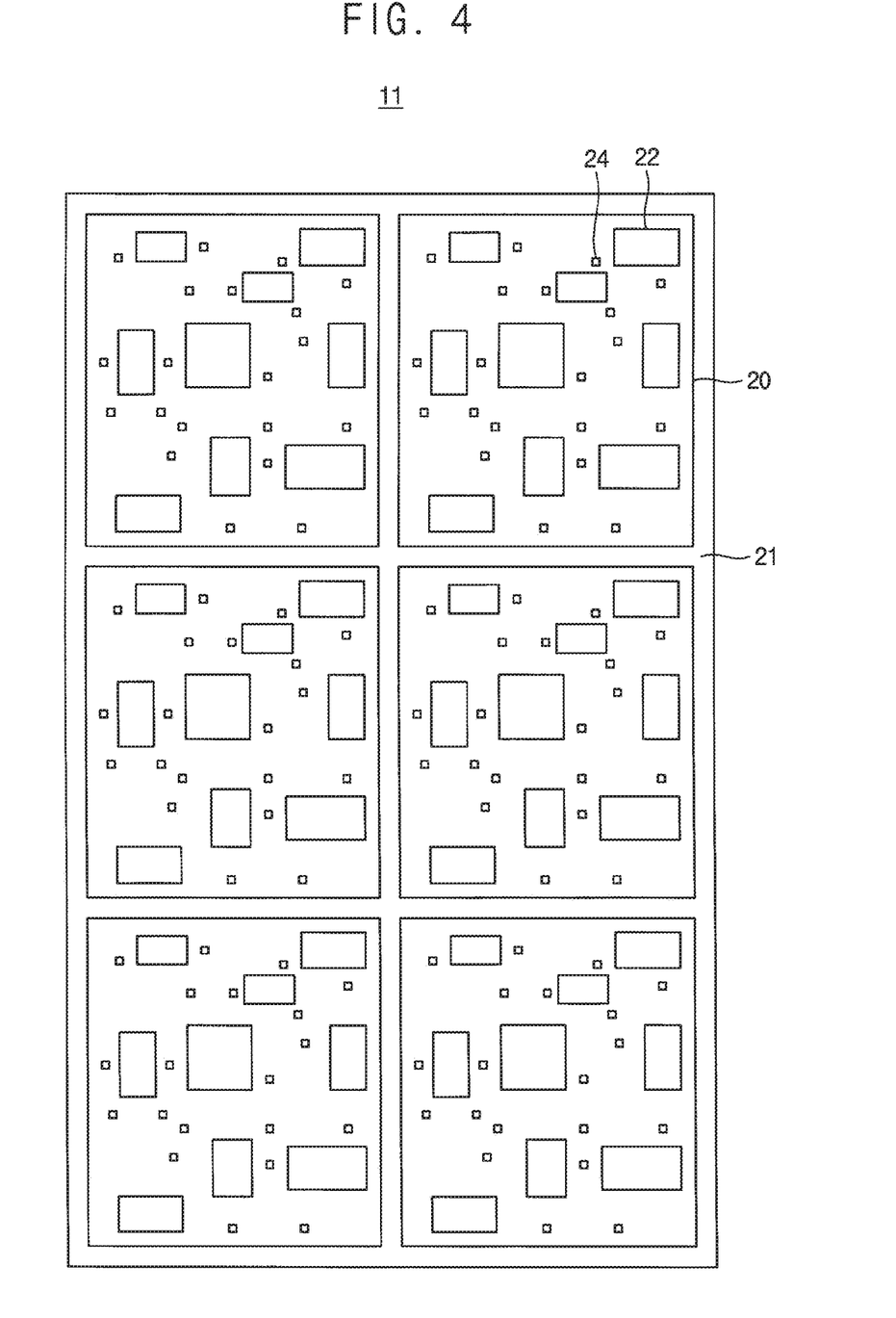
FIG. 4 is a plan view illustrating a photomask in accordance with example embodiments of the inventive concept.
Figure 5:
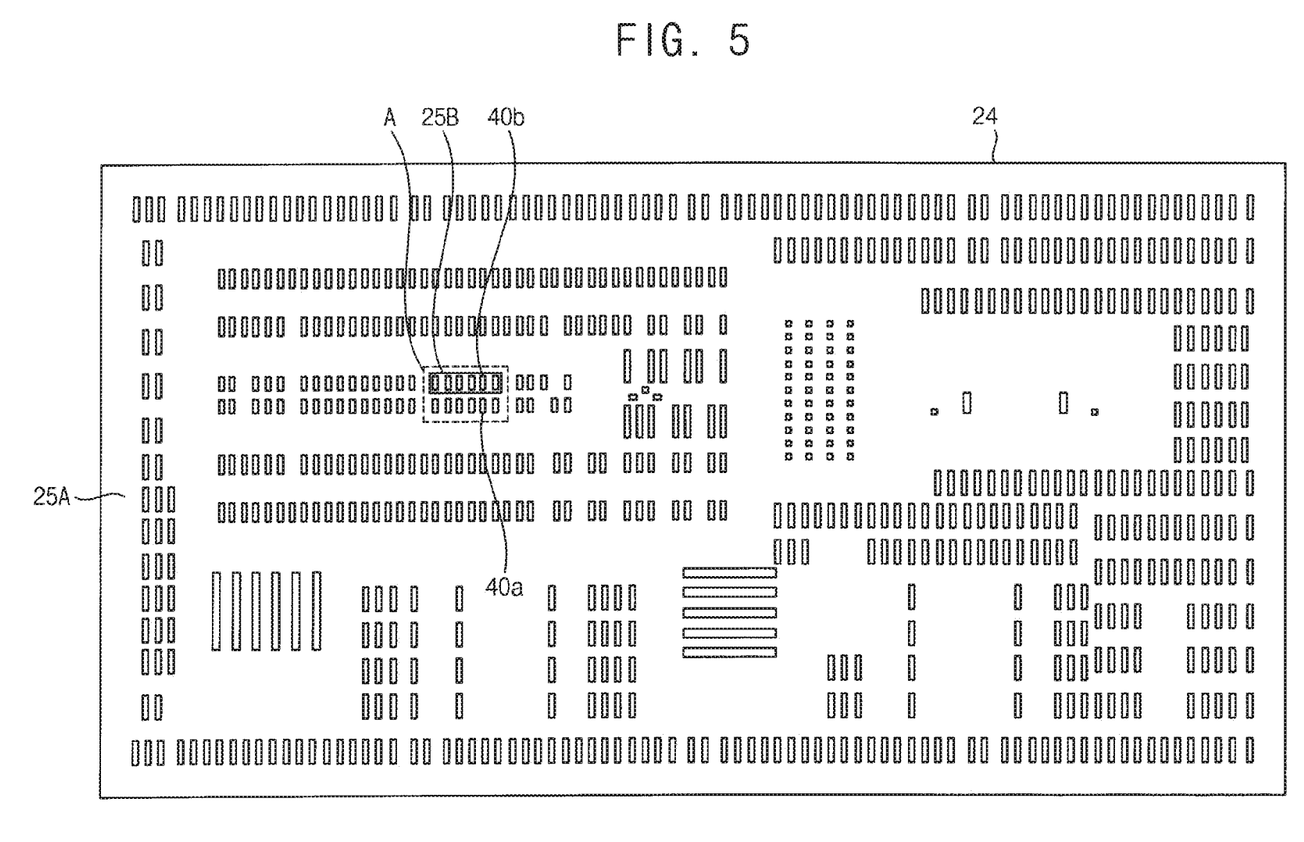
FIG. 5 is a plan view illustrating a layout of a monitoring mask pattern of the photomask in accordance with example embodiments of the inventive concept.
Figure 6:
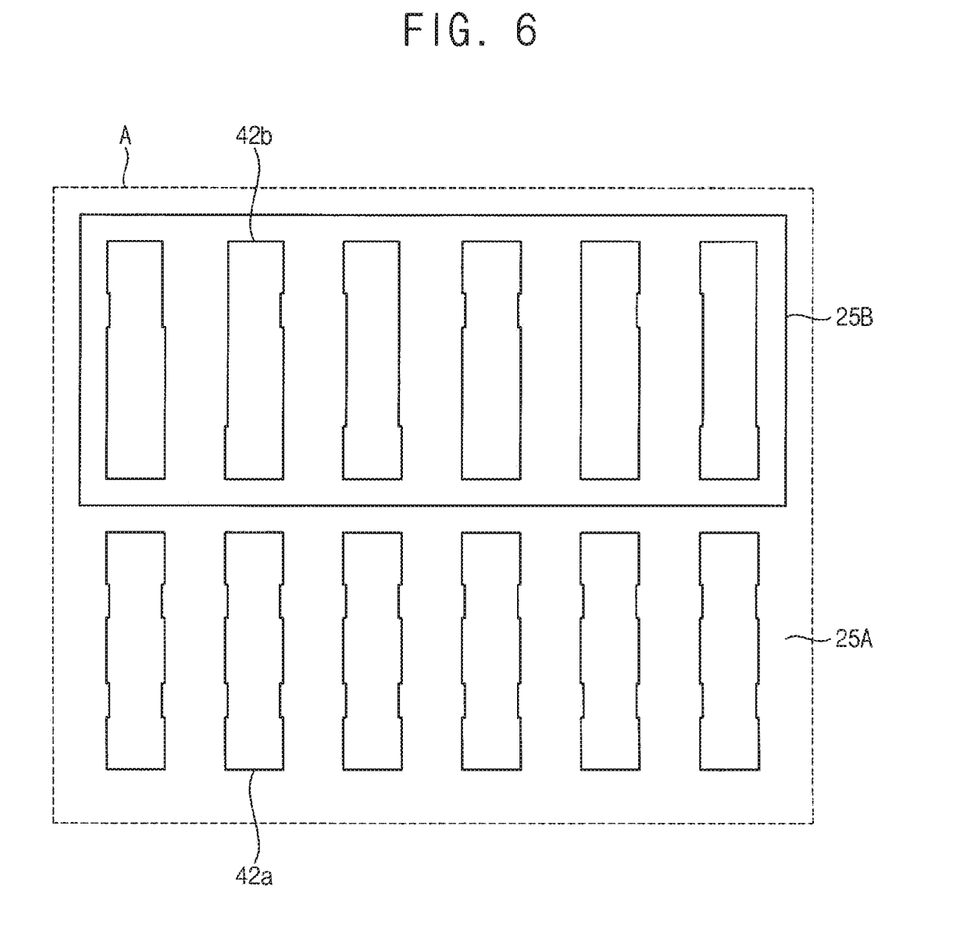
FIG. 6 is a plan view illustrating a corrected monitoring mask pattern formed by performing an optical proximity correction on the monitoring mask pattern of FIG. 5.

FIG. 1 is a flow chart illustrating a method of manufacturing a photomask in accordance with example embodiments of the inventive concept. FIG. 2 is a flow chart illustrating a second optical proximity correction step of the method of manufacturing a photomask of FIG. 1. FIG. 3 is a plan view illustrating a photomask in accordance with example embodiments of the inventive concept. FIG. 4 is a plan view illustrating a photomask in accordance with example embodiments of the inventive concept. FIG. 5 is a plan view illustrating a layout of a monitoring mask pattern of the photomask in accordance with example embodiments of the inventive concept. FIG. 6 is a plan view illustrating a corrected monitoring mask pattern formed by performing an optical proximity correction on the monitoring mask pattern of FIG. 5.

Referring to FIGS. 1 to 6, in a first operation S100, a layout of a circuit mask pattern may be designed within a circuit mask region 22 of a mask region 20.

In example embodiments, the layout of the circuit mask pattern corresponding to an actual circuit pattern to be formed on a substrate may be designed within the mask region 20 of a photomask 10, 11.

A circuit layer on a semiconductor wafer may be fabricated by using a scanner to project light through the photomask to transfer a mask pattern on the photomask to the wafer. To form the circuit layer on the wafer, a photoresist layer may be deposited on the wafer, and the circuit mask pattern within the mask region 20 may be transferred to the photoresist layer by a photolithography process, such as an EUV lithography process.

The mask region 20 may be a region corresponding to a chip region of the wafer where actual integrated circuits are formed, and the circuit mask region 22 may be a region corresponding to a cell region where actual cells are formed within the chip region of the wafer. The circuit mask pattern may be formed within the circuit mask region 22 of the mask region 20, and the circuit mask pattern may be transferred to the cell region within the chip region of the wafer.

The photomask may include one or more mask regions 20. The photomask 10 of FIG. 3 may include one mask region 20. The photomask 10 of FIG. 4 may include six mask regions 20. It will be understood, however, that the number of mask regions 20 shown in FIGS. 3 and 4 are examples and that a number of mask regions 20 in a photomask 10, 11 is not limited to a specific number in accordance with various embodiments of the inventive concept.

Then, in a second operation S110, a layout of a monitoring mask pattern may be designed within a monitoring mask region 24 of the mask region 20.

In example embodiments, coordinates of the monitoring mask region 24 of the mask region 20 may be determined and the layout of the monitoring mask pattern having the same dimension as at least a portion of the circuit mask pattern may be designed within the monitoring mask region 24. The monitoring mask pattern of the photomask pattern may be transferred to the substrate to form an actual monitoring pattern structure, and the actual monitoring pattern may have the same or similar dimension as at least a portion of the actual circuit pattern.

The monitoring mask region 24 may be positioned outside the circuit mask region 22. The monitoring mask pattern may be located in a position that is not occupied by the circuit mask pattern or circuit mask region 22. The monitoring mask pattern may be formed in a position that does not overlap with the circuit mask pattern or circuit mask region 22.

A plurality of the monitoring mask patterns may be formed respectively in the monitoring mask regions 24 outside the circuit mask regions 22. The monitoring mask regions 24 may be distributed densely and regularly across the mask region 20. Accordingly, the monitoring mask patterns may be distributed generally uniformly across the mask region 20. For example, about 100 or more monitoring mask regions 24 may be located in an image field per one shot. Additionally, at least one monitoring mask region 24 may be located per 2×2 mm$^2$ of the mask region 20.

A semiconductor device having integrated circuits may be fabricated on a wafer using a set of photomasks. Each of the photomasks may correspond a respective patterned layers (e.g., a patterned metal layer, a patterned oxide layer, a patterned polysilicon layer, a patterned via layer, etc.) of the semiconductor device. Each of the photomasks may include a plurality of the monitoring mask regions 24, and corresponding monitoring mask regions 24 on the photomasks may be positioned at the same coordinates on respective photomasks. Accordingly, the corresponding monitoring mask regions 24 of the set of the photomasks may be positioned to overlap with one another in a direction perpendicular to a surface of the substrate on which the patterned layers are formed.

The monitoring mask pattern may have the same or similar geometric feature as at least the portion of the circuit mask pattern. The monitoring mask pattern may have dimensions capable of representing a critical dimension of the circuit mask pattern. Because the monitoring mask pattern has the same or similar dimension as at least a portion of the circuit mask pattern, the same geometric portions (having the same dimension) of the circuit mask pattern and the monitoring mask pattern may be transferred to respective structures having the same or similar dimension on the wafer by the same photolithography process. The monitoring mask pattern may have a standard cell structure capable of representing an actual logic cell to be formed on the wafer.

As illustrated in FIG. 5, in example embodiments, the monitoring mask pattern may include a pattern 40a for detecting critical dimension uniformity (CDU) of a mask in a first region 25A of a mask and a pattern 40b for detecting CDU of a wafer in a second region 25B. That is, the monitoring mask pattern may include the mask-CDU detection pattern 40a and the wafer-CDU detection pattern 40b.

The mask-CDU detection pattern 40a and the wafer-CDU detection pattern 40b of the monitoring mask pattern may represent a circuit mask pattern, which is transferred to a pattern structure, such as an active pin, a dummy gate pattern, a via pattern, etc. of the actual logic cell. For example, the mask-CDU detection pattern 40a and the wafer-CDU detection pattern 40b of the monitoring mask pattern may include a plurality of lines spaced apart from each other, a plurality of dots arranged in an array, etc.

The monitoring mask pattern and the circuit mask pattern within the mask region 20 may be transferred to the photoresist layer by an EUV lithography process. Before the photomask is used to form an actual circuit pattern on a wafer, only the monitoring mask pattern on the photomask may be inspected to measure critical dimension uniformity, a target line width, etc. of the photomask, and then, to determine whether the photomask conforms to a specification. If the photomask is not within specification, the circuit mask pattern may be corrected. The critical dimension uniformity (CDU) of the photomask may be obtained by inspecting the mask-CDU detection pattern of the monitoring mask pattern.

As described below, after the circuit mask pattern of the photomask is transferred to the wafer, the critical dimension uniformity (CDU) of the wafer may be obtained by inspecting a monitoring pattern structure, which is transferred from the mask-CDU detection pattern of the monitoring mask pattern.

Then, in a third operation S120, a first optical proximity correction (OPC) may be performed on the mask-CDU detection pattern 40a of the monitoring mask pattern, and then, in a fourth operation S130, a second optical proximity correction (OPC) may be performed on the wafer-CDU detection pattern 40b of the monitoring mask pattern. Thus, the first and second optical proximity corrections may be performed to form a corrected monitoring mask pattern.

In example embodiments, the first and second optical proximity corrections may include correcting a layout of a pattern to compensate for image errors due to diffraction or process effects. The first and second optical proximity corrections may include, but are not limited to, enlarging the whole size of the monitoring mask pattern and processing corners of each of the patterns. The first and second optical proximity corrections may include, but are not limited to, moving edges or adding extra polygons to each pattern. The first and second optical proximity corrections may, in some embodiments, be driven by pre-computed loop-up tables. However, the optical proximity corrections may not be limited thereto, and the OPCs may include various types of corrections in accordance with different embodiments of the inventive concept.

In example embodiments, the first optical proximity correction on the mask-CDU detection pattern 40a may be performed separately with an optical proximity correction on the circuit mask pattern. The second optical proximity correction on the wafer-CDU detection pattern 40b may be performed together with the optical proximity correction on the circuit mask pattern. The first optical proximity correction may be performed on the mask-CDU detection pattern 40a of the monitoring mask pattern, and then, the second optical proximity optical proximity correction may be performed on the wafer-CDU detection pattern of the monitoring mask pattern and the circuit mask pattern at the same time.

The first optical proximity correction may be performed on the mask-CDU detection pattern 40a of the monitoring mask pattern in view of a desire to perform a precise, yet inconvenient, inspection for the critical dimension uniformity (CDU) of the photomask after manufacturing the photomask. For example, to prevent or reduce the risk or magnitude of an inaccurate measurement due to OPC jog and a local error term, an OPC pattern may be generated or optimized to improve a region of interest (ROI) and to make measurements at multiple locations possible.

The first optical proximity correction may be performed prior to the second optical proximity correction. The first optical proximity correction may be performed on a layout of the mask-CDU detection pattern 40a of the monitoring mask pattern within the mask region 20, which is found through pattern matching, to create the corrected monitoring mask pattern.

In further embodiments, the first optical proximity correction on the mask-CDU detection pattern 40a of the monitoring mask pattern may include inserting a sub-resolution assist feature in the monitoring mask region 24. The insertion of the sub-resolution assist may provide improved coverage on a line-space layout and improved coverage on a complicated 2D layout with a generally fast run time.

The second optical proximity correction may be performed on the wafer-CDU detection pattern 40b of the monitoring mask pattern in in view of a desire to perform a precise, yet inconvenient, inspection for the critical dimension uniformity (CDU) of the wafer performed after transferring the photomask to the wafer.

As illustrated in FIG. 2, in the fourth operation S130, first, an OPC model for compensating for an optic effect in EUV exposure may be selected (S132) and then the selected OPC model may be applied to the wafer-CDU detection pattern 40b and the circuit mask pattern (S134).

As described below, a reflective imaging optic system may be used in the EUV lithography process, and, thus, the optic effect in EUV exposure, such as shadowing effect and flare effect, at a wafer level may occur. The EUV optic effect may cause CD non-uniformity at the wafer level. The second optical proximity correction may be performed on the wafer-CDU detection pattern 40b to prevent or reduce the CD non-uniformity at the wafer level.

As illustrated in FIG. 6, the first optical proximity correction may be performed on the mask-CDU detection pattern 40a to form a corrected mask-CDU detection pattern 42a, and then, the second optical proximity correction may be performed on the wafer-CDU detection pattern 40b to form a corrected mask-CDU detection pattern 42b.

The corrected mask-CDU detection patterns 42a may have the same or similar line widths. A monitoring mask pattern of a photomask, which is manufactured by the corrected mask-CDU detection patterns 42a, may be inspected to precisely detect a critical dimension uniformity (CDU) in the mask.

Because the OPC model is used for compensating for the optic effects occurring due to a slit position of an EUV lithography apparatus, a pattern density, etc., the corrected wafer-CDU detection patterns 42b may have different line widths. A pattern structure on the wafer, which is transferred from a monitoring mask pattern of a photomask manufactured by the corrected wafer-CDU detection patterns 42b, may be inspected to precisely detect a critical dimension uniformity (CDU) in the wafer.

Then, in a fifth operation S140, a photomask having the circuit mask pattern and the monitoring mask pattern may be formed.

As illustrated in FIG. 4, the photomask 11 may include six mask regions 20 corresponding to six chip regions and a peripheral region 21 outside the mask regions 20. The mask region 20 may correspond to a chip region of a wafer and the peripheral region 21 may correspond to a scribe lane region.

The photomask 11 may include a reflective layer and mask patterns formed on the reflective layer. The mask pattern may include an absorbing layer pattern, which absorbs EUV light. The mask pattern may include a circuit mask pattern and a monitoring mask pattern in the mask region 20. The circuit mask pattern may be formed in the circuit mask region 22 of the mask region 20, and the monitoring mask pattern may be formed in the monitoring mask region 24 of the mask region 20. The monitoring mask pattern may include a mask-CDU detection pattern and a wafer-CDU detection pattern.

Although not illustrated in the figures in favor of highlighting other aspects of the inventive concepts, the photomask 11 may further include an alignment key pattern, an overlay pattern, etc. in the peripheral region 21.

Then, in a sixth operation, a critical dimension (CD) of the mask-CDU detection pattern of the monitoring mask pattern formed on the photomask may be measured.

In example embodiments, the critical dimension of the mask-CDU detection pattern of the monitoring mask pattern within the monitoring mask region 24 of the photomask may be measured by critical dimension scanning electron microscopy (CDSEM).

The measured critical dimension may be used to determine a mean critical dimension and a critical dimension uniformity in the mask region 20. Additionally, the critical dimension uniformity on the photomask may be used alone or together with a critical dimension uniformity on a wafer to predict process variations.

Further, if the measurement result of the critical dimension of the monitoring mask pattern is not within specification, the circuit mask pattern may be corrected.

SEM inspection may cause damage at the measurement area and become a bottleneck for providing accurate measurement due to electron charging effects. Because the SEM inspection may be performed only on the monitoring mask region 24 outside the circuit mask region 22 in the mask region 20, the SEM inspection may have no effect on the circuit mask region 22 corresponding to the circuit region where an actual circuit pattern is formed.

Additionally, when the circuit mask pattern of the photomask is transferred to a wafer, an after-development inspection (ADI) and an after-etching inspection (AEI) may be performed, which in some embodiments may be confined to a monitoring region within the chip region of the wafer corresponding to the monitoring mask region 24 of the photomask. Thus, without the benefit of the SEM inspection, a more precise pattern may be formed on the wafer.

Hereinafter, a method of manufacturing a semiconductor device using the photomask in FIG. 4, according to some embodiments of the inventive concept, will be described.

Figure 7:
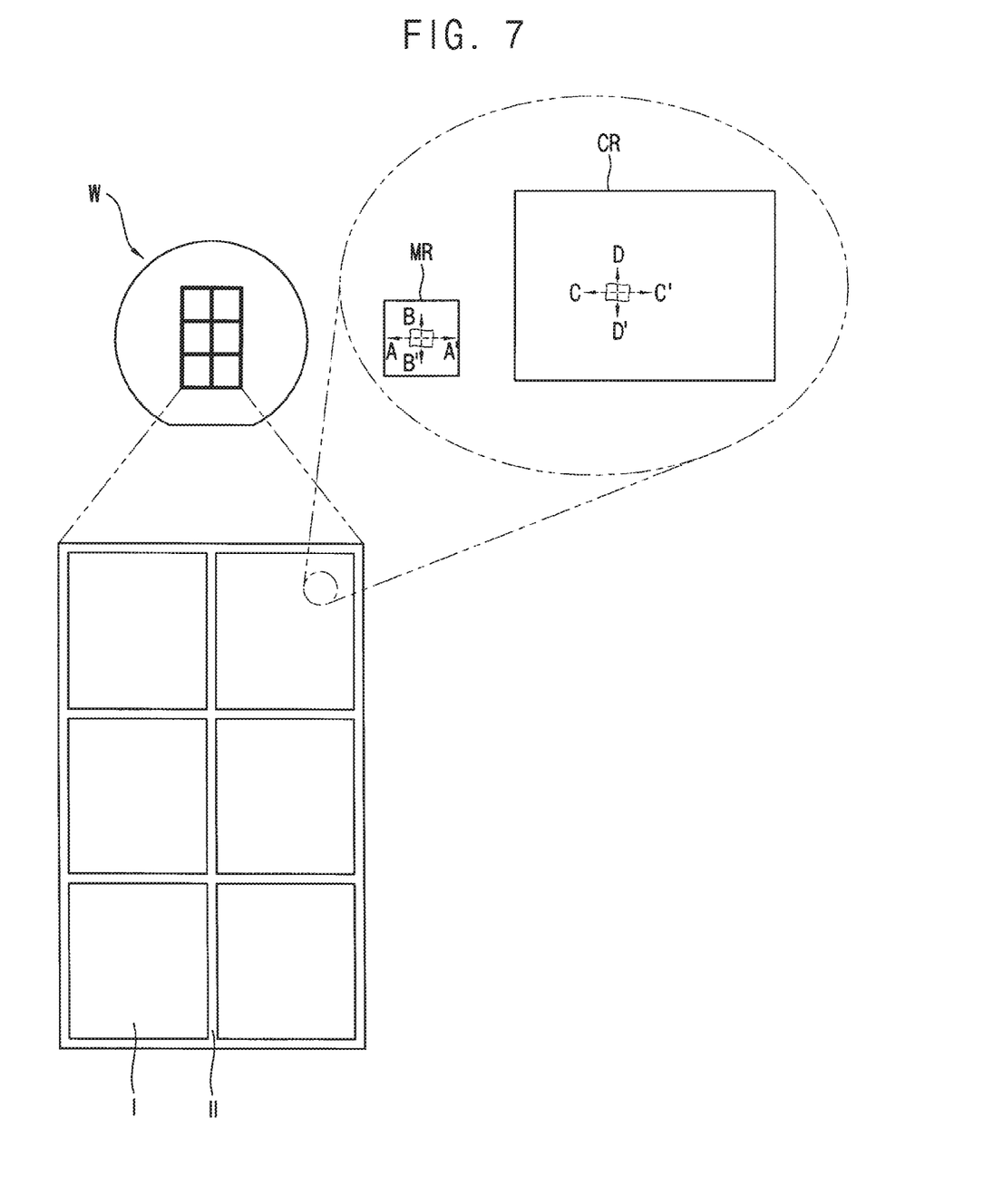
FIG. 7 is a plan view illustrating chip regions of a wafer to be exposed to light through the photomask of FIG. 4.
Figure 8:
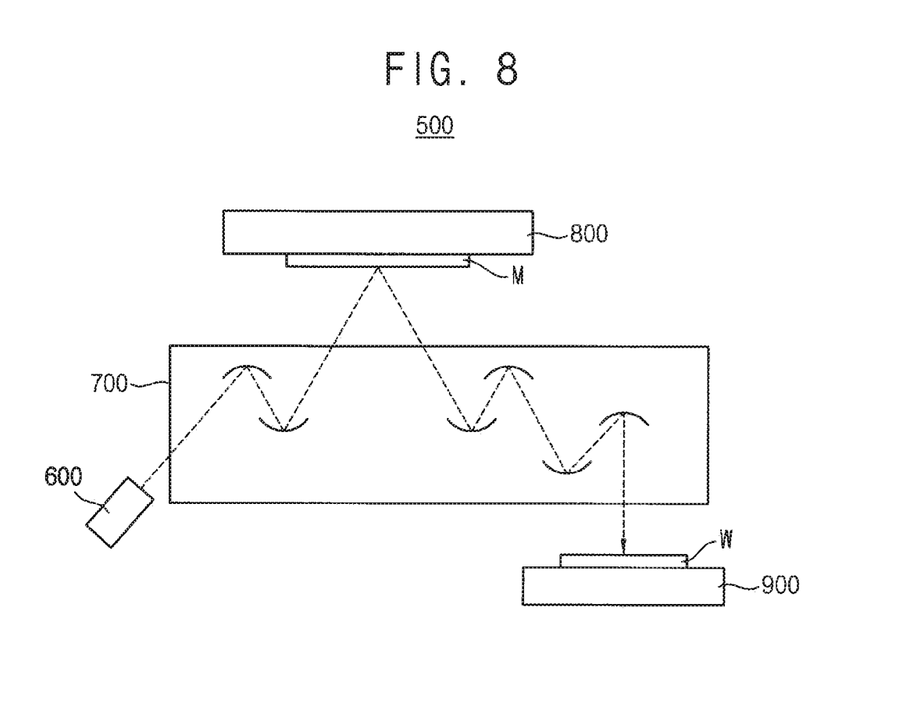
FIG. 8 is a cross-sectional view illustrating an exposure apparatus for performing an Extreme Ultra-Violet (EUV) exposure process using the photomask of FIG. 4 in accordance with example embodiments of the inventive concept.
Figure 9:
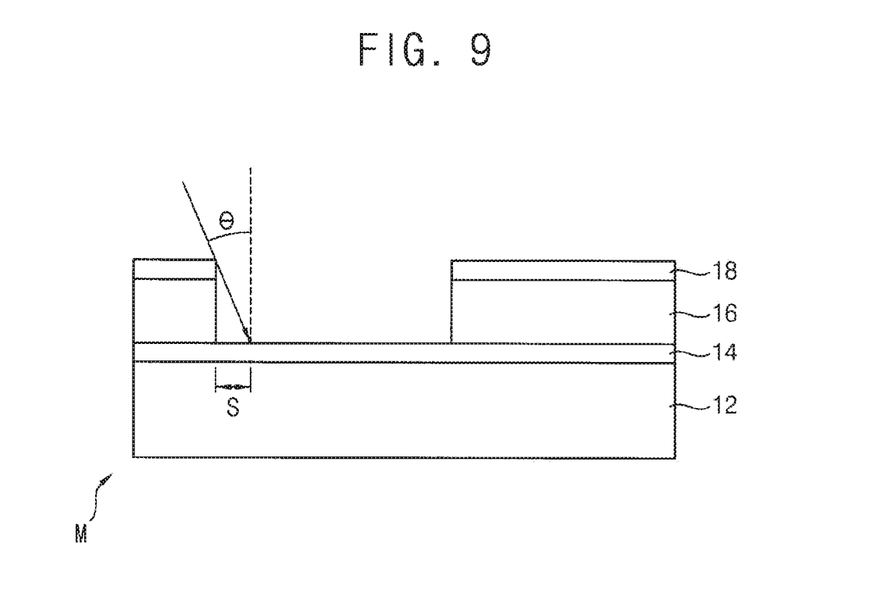
FIG. 9 is a cross-sectional view illustrating a portion of the photomask of FIG. 4 in accordance with example embodiments of the inventive concept.

FIG. 7 is a plan view illustrating chip regions of a wafer to be exposed to light through the photomask of FIG. 4. FIG. 8 is a cross-sectional view illustrating an exposure apparatus for performing an EUV exposure process using the photomask of FIG. 4. FIG. 9 is a cross-sectional view illustrating a portion of the photomask of FIG. 4.

Referring to FIGS. 7 to 9, a semiconductor wafer W may include a plurality of chip regions I and a scribe lane region II. The chip region I may be a die region where a chip is formed, and the scribe lane region may be a region, which is cut by a sawing process. For example, the chip may include a logic device, a memory device, etc., and various patterns therein.

As illustrated in FIG. 7, six chip regions I may be exposed to light using the photomask of FIG. 4 having six mask regions 20. Each of the chip regions I of the wafer may include a plurality of cell regions CR and a plurality of monitoring regions MR.

As illustrated in FIG. 8, an exposure apparatus 500 may include a light illumination portion 600, a mirror system 700, a mask stage 800, and a wafer stage 900. The mirror system 700 may include an illumination mirror system and a projection mirror system.

In example embodiments, the exposure apparatus 500 may perform a reflective photolithography process using a photomask M.

In some embodiments, the light illumination portion 600 may include a light source, a light collector, etc. The light source may generate extreme ultra violet (EUV) light. For example, the light source may generate light, e.g., EUV light, having a wavelength of about 13.5 nm using carbon plasma. The EUV light generated from the light source may be irradiated to the illumination mirror system of the mirror system 700 through the light collector.

The illumination mirror system may include a plurality of illumination mirrors. The illumination mirrors may condense the EUV light to reduce loss of the EUV light, which propagates out of the mirrored irradiating paths.

The mask stage 800 may mount the photomask M on a lower surface thereof and may be configured to move in a horizontal direction, which is generally parallel to an upper surface of the mirror system 700 as shown in the cross-sectional view of FIG. 8. The photomask M may be mounted on the lower surface of the mask stage 800 such that the surface (of the front side) on which optical patterns of the photomask M may be formed, may face downward.

The EUV light transferred from the illumination mirror system may be irradiated to the photomask M mounted on the mask stage 800. The EUV light reflected from the photomask M mounted on the mask stage 800 may be transferred to the projection mirror system.

The projection mirror system may receive the EUV light reflected from the photomask M and may transfer the received EUV light to a wafer W. The projection mirror system may include a plurality of projection mirrors in some embodiments.

The wafer stage 900 may receive the wafer W thereon and may be configured to move in a horizontal direction, which is generally parallel to a lower surface of the mirror system 700 as shown in the cross-sectional view of FIG. 8. In some embodiments, a photoresist layer having a predetermined thickness may be formed on the wafer W, and the EUV light may be focused on the photoresist layer. Accordingly, the exposure apparatus 500 may generate and irradiate the light onto the photoresist layer on the wafer W. Thus, the photoresist layer may be partially exposed based on the optical pattern information of the photomask M to form a photoresist pattern, and then a layer underlying the photoresist pattern may be partially etched to form a pattern on the wafer W.

The circuit mask pattern within the circuit mask region 22 of the photomask M may be transferred to the cell region CR within the chip region I of the wafer W, and the monitoring mask pattern within the monitoring mask region 24 of the photomask M may be transferred to the monitoring region MR within the chip region I of the wafer W by an EUV lithography process.

As illustrated in FIG. 9, the photomask M may include a reflective capping layer 14, an absorbing layer pattern 16, and an anti-reflective coating layer pattern 18 sequentially formed on a reflective multilayer 12. The exposure apparatus 500 for the EUV lithography may use off-axis illumination at a predetermined angle θ within an arch shaped slit of the photomask M, and, thus, the obliquely incident light may cause shadowing effects due to the absorbing layer of the photomask M. EUV optical effects occurring in each slit of full field OPC, that is, the shadowing effects, may result in CD non-uniformity in wafer level.

FIGS. 10 to 13 are cross-sectional views illustrating a method of manufacturing a semiconductor device in accordance with example embodiments of the inventive concept. FIGS. 10 to 13 are cross-sectional views taken along the line A-A' and the line C-C' of FIG. 7. The method of manufacturing the semiconductor device may be performed using the photomask illustrated with reference to FIGS. 1 to 6, and detailed descriptions thereof are omitted herein.

Figure 10:
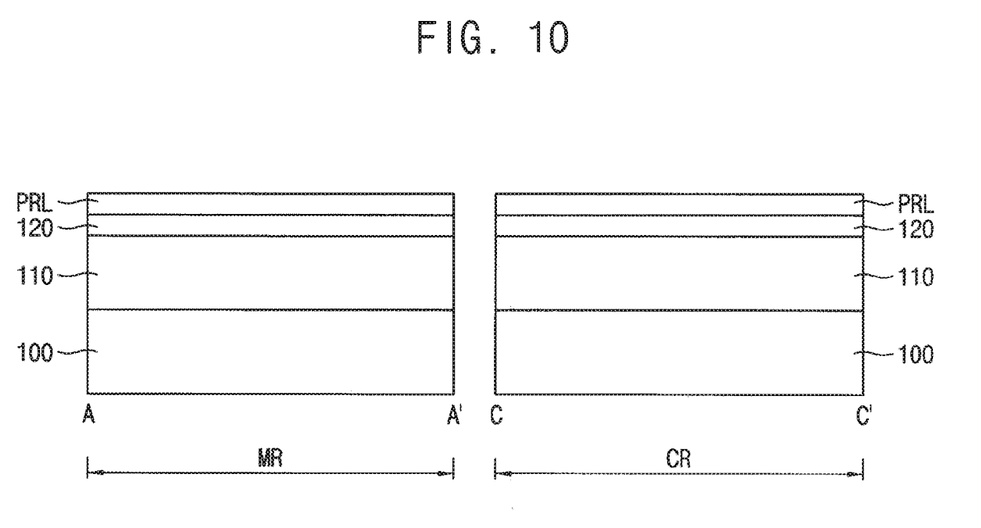
FIGS. 10 to 13 are cross-sectional views illustrating a method of manufacturing a semiconductor device in accordance with example embodiments of the inventive concept.

Referring to FIG. 10, first, an etch target layer 110, a hard mask layer 120, and a photoresist layer PRL may be formed on a substrate 100 including a chip region where an actual circuit layer is formed. The chip region may include a cell region CR and a monitoring region MR. The cell region CR may be a region to which a circuit mask pattern of a photomask is transferred, and the monitoring region MR may be a region to which a monitoring mask pattern of the photomask is transferred. The monitoring mask pattern may include a mask-CDU detection pattern and a wafer-CDU detection pattern. In some embodiments, when a portion of the substrate 100 is etched, the etch target layer 110 may not be formed.

In some embodiments, the hard mask layer 120 may be formed on the etch target layer 110. The hard mask layer 120 may include a material that may serve as an etching mask for the etch target layer 110. For example, the hard mask layer 120 may be formed of silicon nitride or silicon oxynitride. In other embodiments, the hard mask layer 120 may be formed of silicon oxide.

An underlying layer (not shown in the figures in favor of highlighting other features of embodiments of the inventive concept) may be formed between the hard mask layer 120 and the photoresist layer PRL. The underlying layer may include a material that can be chemically cross-linked with the photoresist layer PRL. In other embodiments, the underlying layer may be omitted. After coating the photoresist layer PRL, a bake process may be performed.

Figure 11:
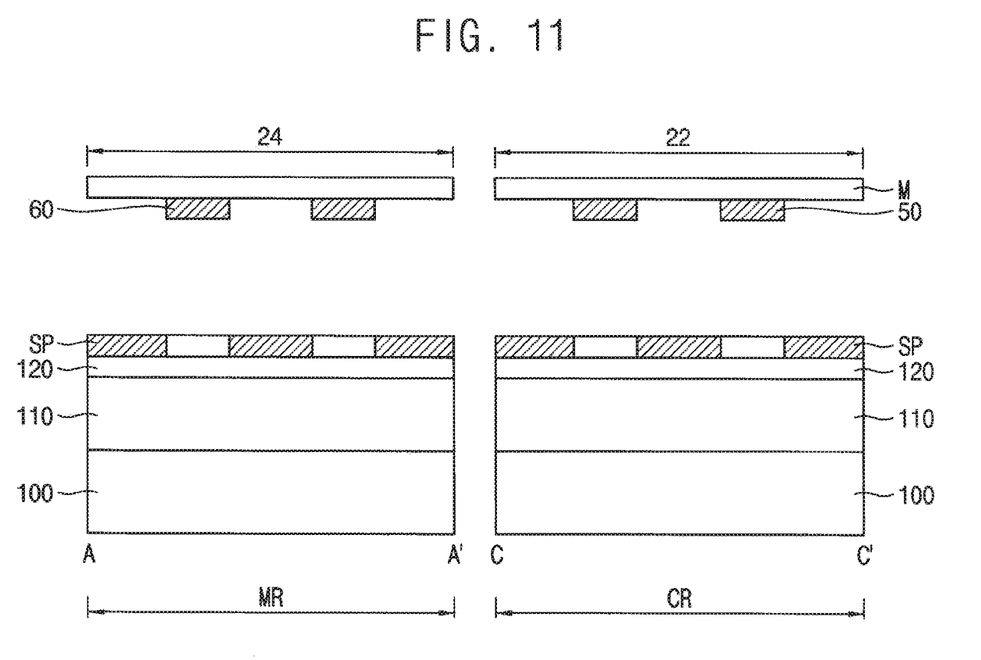
Figure 12:
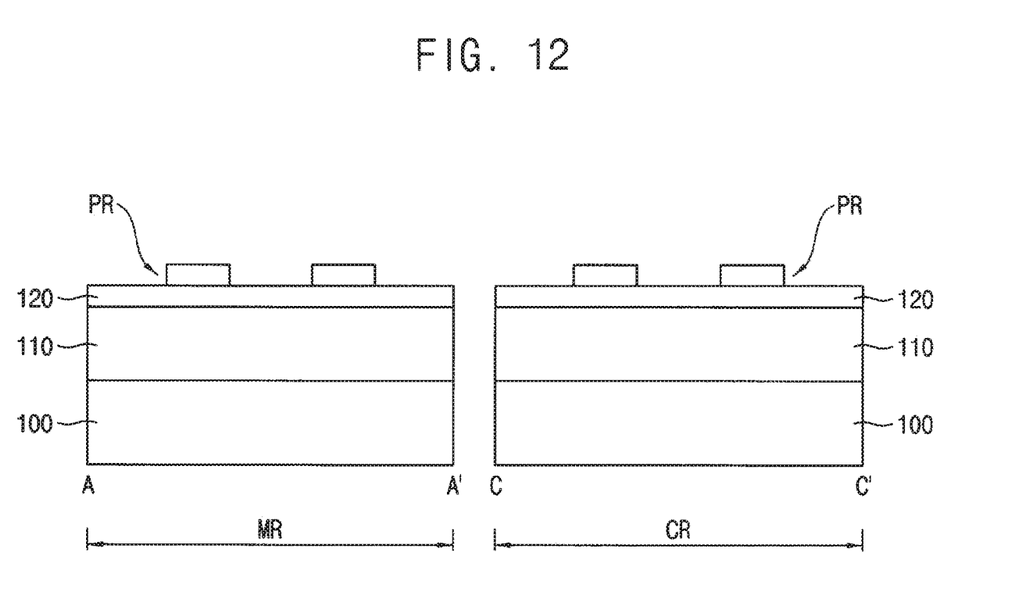

Referring to FIGS. 11 and 12, after manufacturing the photomask M illustrated with reference to FIGS. 1, 2, and 4, an EUV photolithography process may be performed on the photoresist layer PRL using the photomask M to form a photoresist pattern PR.

The photomask M may include a circuit mask region 22 and a monitoring mask region 24. A circuit mask pattern 50 may be formed in the circuit mask region 22, and a monitoring mask pattern 60 may be formed in the monitoring mask region 24. The monitoring mask pattern 60 may include a mask-CDU detection pattern and a wafer-CDU detection pattern. The monitoring mask pattern 60 may have the same or similar geometric structure as at least a portion of the circuit mask pattern 50. The monitoring mask pattern 60 may have dimensions capable of representing a critical dimension of the circuit mask pattern 50. Because the monitoring mask pattern 60 has the same or similar dimension as at least the portion of the circuit mask pattern 50, the monitoring mask pattern 60 may have a standard cell structure capable of representing an actual circuit pattern to be formed on the cell region CR of the substrate 100.

First, the circuit mask pattern 50 of the photomask M may be transferred to the photoresist layer PRL in the cell region CR, and the monitoring mask pattern 60 of the photomask M may be transferred to the photoresist layer PRL in the monitoring region MR by an EUV exposure process. When a positive tone photoresist is used, a portion SP of the photoresist layer that is exposed to light may become soluble to a photoresist developer.

Then, a developing process may be performed to form the photoresist pattern PR having a circuit pattern structure in the cell region CR and a monitoring pattern structure in the monitoring region MR. For example, the exposed portion SP of the photoresist layer PRL may be dissolved by the photoresist developer to form the photoresist pattern PR. After the developing process, a post-development bake process may be performed. The monitoring pattern structure may include a mask-CDU detection pattern structure, which is transferred from the mask-CDU detection pattern and a wafer-CDU detection pattern structure, which is transferred from the wafer-CDU detection pattern.

In example embodiments, after forming the photoresist pattern PR, an after-development inspection (ADI) process may proceed. The ADI process may be performed only on the wafer-CDU detection pattern structure of the monitoring pattern structure in the monitoring region MR.

Additionally, a correlation between a critical dimension uniformity of the mask-CDU detection pattern of the monitoring mask pattern 60 obtained by the inspection process before a supply of the manufactured photomask and a critical dimension uniformity of the wafer-CDU detection pattern structure of the monitoring pattern structure obtained by the ADI process may be calculated.

Figure 13:
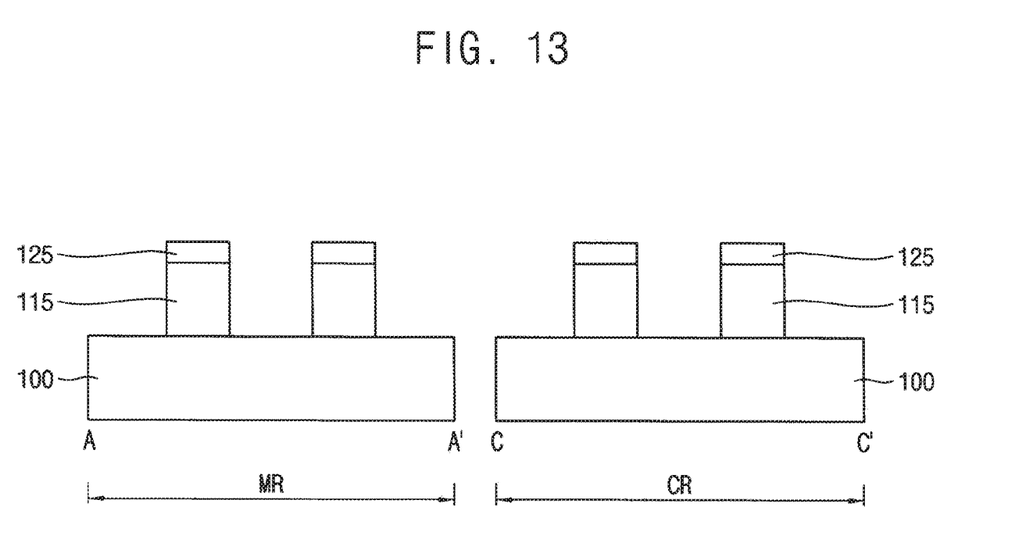

Referring to FIG. 13, the etch target layer 110 may be etched by an etching process using the photoresist pattern PR as an etching mask to form an etch target layer pattern 115.

In some embodiments, the hard mask layer may be patterned using the photoresist pattern PR as an etching mask to form a hard mask pattern 125, and the photoresist pattern PR may be removed from the substrate 100. Then, the etch target layer 110 may be patterned using the hard mask pattern 125 as an etching mask to form the etch target layer pattern 115.

Thus, the circuit mask pattern 50 of the photomask M may be transferred to form a circuit pattern in the cell region CR of the substrate 100, and the monitoring mask pattern 60 of the photomask M may be transferred to form a monitoring pattern in the monitoring region MR of the substrate 100. The monitoring pattern may include a mask-CDU detection monitoring pattern, which is transferred from the mask-CDU detection pattern structure and a wafer-CDU detection monitoring pattern, which is transferred from the wafer-CDU detection pattern structure.

In example embodiments, after the circuit pattern and the monitoring pattern are formed on the substrate 100, an after-etching inspection (AEI) process may proceed. The AEI process may be performed only on the wafer-CDU detection monitoring pattern of the monitoring pattern in the monitoring region MR.

Additionally, a correlation between the critical dimension uniformity of the mask-CDU detection pattern of the monitoring mask pattern, the critical dimension uniformity of the wafer-CDU detection pattern structure of the monitoring pattern structure obtained by the ADI process, and a critical dimension uniformity of the wafer-CDU detection monitoring pattern of the monitoring pattern obtained by the AEI process may be calculated.

The above method embodiments of manufacturing the photomask and the method embodiments of manufacturing the semiconductor device using the same may be applied to methods of manufacturing various types of memory devices and systems including a wiring structure. For example, some method embodiments may be applied to logic devices, such as central processing units (CPUs), main processing units (MPUs), application processors (APs), or the like. Additionally, these method embodiments may be applied to volatile memory devices, such as DRAM devices or SRAM devices, or non-volatile memory devices, such as flash memory devices, PRAM devices, MRAM devices, ReRAM devices, or the like.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages of the present invention. Accordingly, all such modifications are intended to be included within the scope of example embodiments as defined in the claims.

What is claimed is:

1. A method, comprising:
designing a layout of a circuit mask pattern in a mask region corresponding to a chip region of a substrate;
designing a layout of a monitoring mask pattern representing a critical dimension (CD) of the circuit mask pattern in the mask region, the monitoring mask pattern comprising a mask-critical dimension uniformity (CDU) detection pattern configured to detect CDU in mask and a wafer-CDU detection pattern configured to detect CDU in wafer;
performing a first optical proximity correction (OPC) on the mask-CDU detection pattern;
performing a second optical proximity correction on the wafer-CDU detection pattern; and
forming a photomask comprising the circuit mask pattern and the monitoring mask pattern.

2. The method of claim 1, wherein designing the layout of the monitoring mask pattern comprises:
locating a monitoring mask region within the mask region in a position that is not occupied by the circuit mask pattern; and
designing the monitoring mask pattern within the monitoring mask region.

3. The method of claim 1, wherein the monitoring mask pattern has about a same dimension as at least a portion of the circuit mask pattern.

4. The method of claim 1, wherein designing the layout of the monitoring mask pattern comprises designing monitoring mask patterns in positions outside a region of the circuit mask pattern.

5. The method of claim 1, further comprising:
performing the second optical proximity correction on the circuit mask pattern.

6. The method of claim 5, wherein the second optical proximity correction is performed on the wafer-CDU detection pattern and the circuit mask pattern at a same time.

7. The method of claim 1, wherein performing the first optical proximity correction on the mask-CDU detection pattern comprises performing the first optical proximity correction on a region that is not occupied by the wafer-CDU detection pattern in the layout of the monitoring mask pattern.

8. The method of claim 1, wherein performing the second optical proximity correction on the wafer-CDU detection pattern comprises:
determining an OPC model for compensating for an optic effect of extreme ultra-violet (EUV) exposure; and
applying the OPC model to the wafer-CDU detection pattern and the circuit mask pattern.

9. The method of claim 1, further comprising:
measuring a critical dimension of the mask-CDU detection pattern of the photomask.

10. The method of claim 9, further comprising:
correcting the circuit mask pattern when the critical dimension of the mask-CDU detection pattern is not within specification.

11. A method, comprising:
designing a layout of a circuit mask pattern in a mask region corresponding to a chip region of a substrate;
designing a layout of a monitoring mask pattern representing a critical dimension (CD) of the circuit mask pattern in the mask region, the monitoring mask pattern comprising a mask-critical dimension uniformity (CDU) detection pattern and a wafer-CDU detection pattern;
performing a first optical proximity correction (OPC) on the mask-CDU detection pattern;
performing a second optical proximity correction on the wafer-CDU detection pattern and the circuit mask pattern;
forming a photomask comprising the circuit mask pattern and the monitoring mask pattern; and
measuring a critical dimension of the mask-CDU detection pattern of the photomask.

12. The method of claim 11, wherein performing the first optical proximity correction on the mask-CDU detection pattern comprises performing the first optical proximity correction on a region that is not occupied by the wafer-CDU detection pattern in the layout of the monitoring mask pattern.

13. The method of claim 11, wherein performing the second optical proximity correction on the wafer-CDU detection pattern and the circuit mask pattern comprises:
   determining an OPC model for compensating for an optic effect of extreme ultra-violet (EUV) exposure; and
   applying the OPC model to the wafer-CDU detection pattern and the circuit mask pattern.

14. The method of claim 11, further comprising:
   correcting the circuit mask pattern when the critical dimension of the mask-CDU detection pattern is not within specification.

15. The method of claim 1, wherein the monitoring mask pattern has about a same dimension as at least a portion of the circuit mask pattern.

16. A method of manufacturing a semiconductor device, comprising:
   sequentially forming an etch target layer and a photoresist layer on a substrate having a chip region and a scribe lane region;
   performing a photolithography process on the photoresist layer using a photomask comprising a circuit mask pattern and a monitoring mask pattern comprising a same dimension of at least a portion of the circuit mask pattern, the monitoring mask pattern comprising a mask-critical dimension uniformity (CDU) detection pattern and a wafer-CDU detection pattern, to form a photoresist pattern comprising a circuit pattern structure transferred from the circuit mask pattern and a mask-CDU detection pattern structure and a wafer-CDU detection pattern structure transferred from the mask-CDU detection pattern and the wafer-CDU detection pattern of the monitoring mask pattern, respectively; and
   measuring a critical dimension of the wafer-CDU detection pattern structure.

17. The method of claim 16, further comprising:
   performing an etching process on the etch target layer using the photoresist pattern as an etching mask to form a target pattern.

18. The method of claim 16, wherein the target pattern comprises a mask-CDU detection monitoring pattern and a wafer-CDU detection monitoring pattern that are formed using the mask-CDU detection pattern structure and the wafer-CDU detection pattern structure as etching masks, respectively.

19. The method of claim 18, further comprising:
   measuring a critical dimension of the wafer-CDU detection monitoring pattern.

20. The method of claim 16, wherein the photolithography process comprises an extreme ultra-violet (EUV) lithography process.

* * * * *